United States Patent
Murayama et al.

(10) Patent No.: US 6,415,414 B1
(45) Date of Patent: Jul. 2, 2002

(54) ENCODING APPARATUS AND METHOD, DECODING APPARATUS AND METHOD, AND PROVIDING MEDIUM

(75) Inventors: Jun Murayama, Tokyo; Masayuki Hattori, Kanagawa, both of (JP)

(73) Assignee: Sony Corporation, Tokyo (JP)

(*) Notice: Subject to any disclaimer, the term of this patent is extended or adjusted under 35 U.S.C. 154(b) by 0 days.

(21) Appl. No.: 09/389,940

(22) Filed: Sep. 3, 1999

(30) Foreign Application Priority Data

Sep. 8, 1998 (JP) .......................................... 10-253586

(51) Int. Cl.⁷ ............................................... G06F 11/00
(52) U.S. Cl. ........................ 714/795; 714/786; 714/755
(58) Field of Search ................................ 714/795, 755, 714/786

(56) References Cited

U.S. PATENT DOCUMENTS 6,233,711 B1 * 5/2001 Murayama et al. ......... 714/786

* cited by examiner

*Primary Examiner*—Phung M. Chung
(74) *Attorney, Agent, or Firm*—Frommer Lawrence & Haug LLP; William S. Frommer

(57) ABSTRACT

In the invention, such replacement is performed that the sum of distances between two points before and after replacement is large, and in the case where replacement positions are regarded as a sequence, the sequence satisfies k-equidistributioness. At step S1, a replacement array by an affine interleaver is set. At steps S2 and S3, an M-sequence is generated, and a function L(t, u) is obtained by the existence position of 0 and 1. By data obtained through these processes, at step S4, a final replacement array is set.

16 Claims, 11 Drawing Sheets

FIG. 2
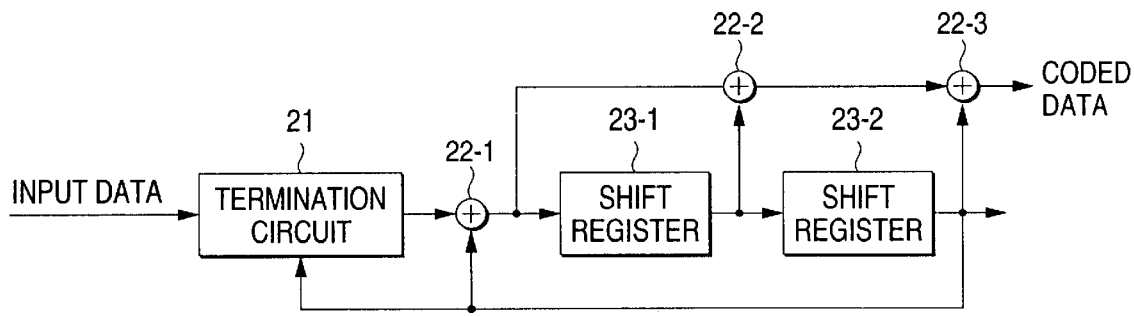
FIG. 3
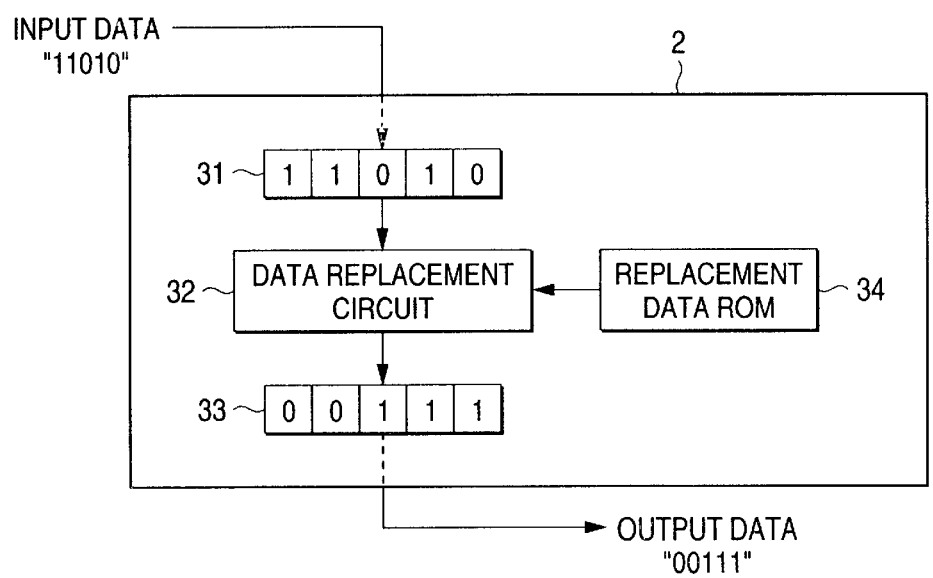
FIG. 4
| INPUT DATA POSITION | 0 | 1 | 2 | 3 | 4 |
|---|---|---|---|---|---|
| OUTPUT DATA POSITION | 4 | 2 | 0 | 3 | 1 |

FIG. 10

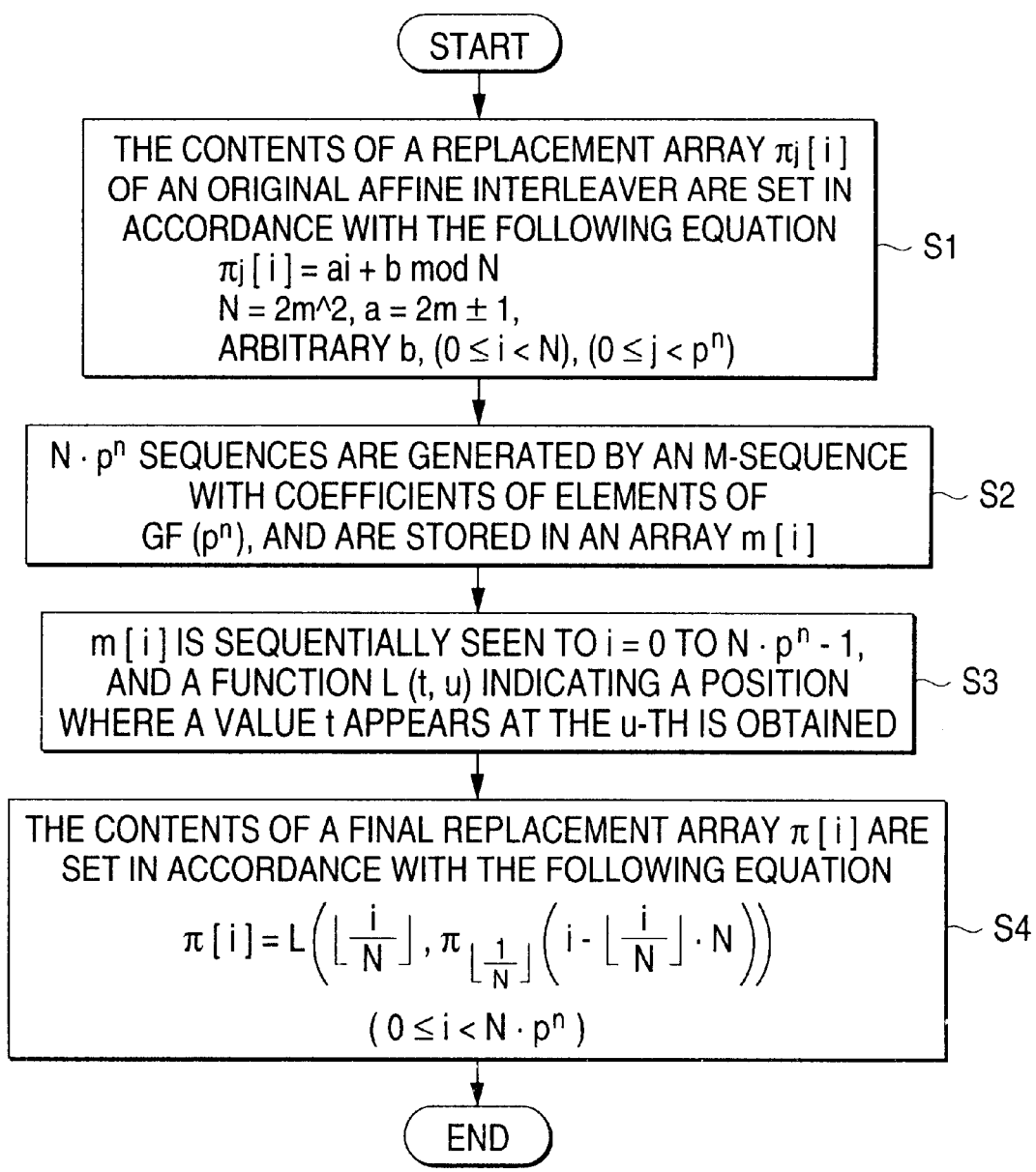

START
↓
S1: THE CONTENTS OF A REPLACEMENT ARRAY $\pi_j[i]$ OF AN ORIGINAL AFFINE INTERLEAVER ARE SET IN ACCORDANCE WITH THE FOLLOWING EQUATION
$\pi_j[i] = ai + b \bmod N$
$N = 2m^2, a = 2m \pm 1,$
ARBITRARY b, $(0 \leq i < N), (0 \leq j < p^n)$

↓

S2: $N \cdot p^n$ SEQUENCES ARE GENERATED BY AN M-SEQUENCE WITH COEFFICIENTS OF ELEMENTS OF $GF(p^n)$, AND ARE STORED IN AN ARRAY $m[i]$

↓

S3: $m[i]$ IS SEQUENTIALLY SEEN TO $i = 0$ TO $N \cdot p^n - 1$, AND A FUNCTION $L(t, u)$ INDICATING A POSITION WHERE A VALUE t APPEARS AT THE u-TH IS OBTAINED

↓

S4: THE CONTENTS OF A FINAL REPLACEMENT ARRAY $\pi[i]$ ARE SET IN ACCORDANCE WITH THE FOLLOWING EQUATION
$$\pi[i] = L\left(\left\lfloor\frac{i}{N}\right\rfloor, \pi_{\lfloor\frac{i}{N}\rfloor}\left(i - \left\lfloor\frac{i}{N}\right\rfloor \cdot N\right)\right)$$
$(0 \leq i < N \cdot p^n)$

↓
END

ENCODING APPARATUS AND METHOD, DECODING APPARATUS AND METHOD, AND PROVIDING MEDIUM

BACKGROUND OF THE INVENTION

1. Field of the Invention

The present invention relates to an encoding apparatus and method, a decoding apparatus and method, and a providing medium, and particularly to an encoding apparatus and method, a decoding apparatus and method, and a providing medium which are suitably applied when encoding or decoding of a turbo code is performed.

A turbo code is known as a code showing performance close to Shannon limit as a theoretical limit of code performance. In this turbo code, encoding is performed through a structure in which a plurality of convolution encoding circuits and interleavers (interleave circuits) are combined, and at a decoding side, exchange of information concerning input data is made among a plurality of decoding circuits outputting soft outputs, so that a final decoding result is obtained.

FIG. 1 shows a structure of a conventional turbo encoding apparatus 10. This turbo encoding apparatus 10 includes a convolution encoding circuit 1-1 for performing convolution encoding with respect to input data to obtain encoded data, interleavers 2-1 to 2-(N−1) for sequentially interleaving the input data (hereinafter, in the case where it is not necessary to distinguish the interleavers 2-1 to 2-(N−1) individually, each is merely referred to as an interleaver 2. It is the same with other devices.), and convolution encoding circuits 1-2 to 1-N for performing convolution encoding with respect to the output data of the interleavers 2 respectively to obtain encoded data.

Here, the convolution encoding circuits 1 perform convolution encoding operations with respect to inputted data, and output the operation results respectively as encoded data. The interleavers 2 alter the sequence of inputted data and output them.

FIG. 2 shows an example of the convolution encoding circuit 1. The convolution encoding circuit shown in FIG. 2 is a feedback type convolution encoding circuit with a constraint length of three. This convolution encoding circuit 1 includes a termination circuit 21, three exclusive OR circuits (hereinafter referred to as "EXOR circuit") 22-1 to 22-3, and two shift registers 23-1 and 23-2, and generates encoded data from input data.

Here, the shift register 23 functions as a delay element for delaying inputted data by one unit time, and the EXOR circuit 22 outputs exclusive OR of inputted data. The termination circuit 21 outputs the input data until all of the input data are encoded, and outputs feedback data for only a two-unit time (time corresponding to the number of the shift registers) from the point of time when encoding is completed. A process after all the input data are encoded is called a termination in which all the contents of the shift registers 23 are returned to zero, and the decoding side performs decoding on the assumption of this process.

FIG. 3 shows an example of the interleaver 2. The input data inputted to the interleaver 2 are temporarily stored in an input data holding memory 31, and then, sequence is rearranged by a data replacement circuit 32. The rearrangement of the sequence of the data is performed on the basis of the contents (replacement position information) of a replacement data ROM (Read Only Memory) 34. The data in which the sequence is rearranged are stored in an output data holding memory 33, and then, are outputted as output data.

FIG. 3 shows an example of an operation of the interleaver 2 in the case where the size of the interleaver 2 is five and the contents of the replacement data ROM 34 are as shown in FIG. 4. That is, when the input data are "11010", in accordance with the data stored in the replacement data ROM 34, the data replacement circuit 32 performs a replacement process of the input data, so that "00111" are outputted as output data.

The operation of the turbo encoding apparatus 10 shown in FIG. 1 will be described. The input data are supplied to the convolution encoding circuit 1-1. In this convolution encoding circuit 1-1, a convolution encoding operation is performed to the input data, and the termination is subsequently performed, so that encoded data through the encoding process including the termination are outputted.

Besides, the input data are supplied to the series circuit of the interleavers 2-1 to 2-(N−1), and the sequence of the inputted data is sequentially altered and the data are outputted. The output data of the interleavers 2-1 to 2-(N−1) are supplied to the corresponding convolution encoding circuits 1-2 to 1-N, respectively. In the convolution encoding circuits 1-2 to 1-N, the convolution encoding operation is performed to the output data of the corresponding interleavers 2-1 to 2-(N−1) respectively, and the termination is subsequently performed, so that encoded data through the encoding process including the termination are outputted.

FIG. 5 shows the relation between the number of bits of input data and that of encoded data in the turbo encoding apparatus 10. After the inputted k-bit input data are converted into a $n_1$-bit code by the convolution encoding circuit 1-1, a $t_1$-bit termination code is further added, so that the data become a $(n_1+t_1)$-bit code in total. Similarly, $(n_2+t_2)$ to $(n_m+t_m)$-bit encoded data are outputted from the convolution encoding circuits 1-2 to 1-N.

FIG. 6 shows a structure of a conventional turbo decoding apparatus 40. This turbo decoding apparatus 40 includes a plurality of soft output decoding circuits 51-1 to 51-N corresponding to the number of encoded data (reception data) outputted from the turbo encoding apparatus 10. The soft output decoding circuits 51-1 to 51-N are structured by using a so-called soft output decoding system having a function to calculate a probability that the input data at the encoding side is 0 or 1, such as a MAP (Maximum Aposteriori Probability) decoder and a SOVA (Soft Output Viterbi Algorithm) decoder.

The operation of the turbo decoding apparatus 40 shown in FIG. 6 will be described. The reception data (encoded data) are supplied to the soft output decoding circuits 51-1 to 51-N, respectively. The respective decoding circuits 51-1 to 51-N mutually use estimation probability value data with respect to the input data except the termination bit at the encoding side, and several to several tens repetitive decoding operations are performed. Final decoded data are outputted from an arbitrary decoding circuit (in FIG. 6, the decoding circuit 51-1).

FIG. 7 shows the relation among the number of bits of the reception data of the turbo decoding apparatus 40, that of the estimation probability value data, and that of the decoded data, and corresponds to the relation of the respective numbers of bits in the turbo encoding apparatus 10 in FIG. 1. The soft output decoding circuits 51-1 to 51-N calculate k-bit estimation probability value data of the input data except the termination bit from the $(n_1+t_1)$ to $(n_m+t_m)$-bit reception data. The k-bit estimation probability value data are exchanged among the respective decoding circuits, and k-bit decoded data are finally outputted.

Now, for the purpose of obtaining a high error correction capability in a turbo encoding apparatus and a decoding apparatus, in general, it is necessary that the interleaver 2 satisfies the following two conditions at the same time.

[Condition 1] The sum of distances between arbitrary two points after-replacement becomes sufficiently larger than that before the replacement.

[Condition 2] In the case where replacement positions are regarded as a sequence, the sequence satisfies a mathematical property called k-equidistributioness.

The foregoing two conditions relate to performance index values defined for an error correction code, which are called a minimum distance of a code and a multiplicity of a minimum distance code. These two conditions are necessitated in order for the error correction code to show excellent performance. The condition 1 corresponds to that the minimum distance becomes large, and the condition 2 corresponds to that the multiplicity of the minimum distance code becomes small.

However, in the interleaver 2 of the foregoing turbo encoding apparatus 10, data stored in the replacement data ROM 34 and generated by using random numbers are used as data for determining replacement positions. In the replacement positions generated as a result of use of such random numbers, the k-equidistributioness of the condition 2 can be satisfied. However, since there occurs a case where the sum of distances between arbitrary two points before and after the replacement becomes small, the condition 1 can not be satisfied.

Other than the interleaver to determine a replacement position by using random numbers, there is an affine interleaver. Although this affine interleaver is suitable as an interleaver satisfying the condition 1, it can not satisfy the condition 2.

Like this, in the conventionally used interleaver, there has been a problem that the foregoing condition 1 and the condition 2 can not be satisfied at the same time.

SUMMARY OF THE INVENTION

The present invention has been made in view of such circumstances, and an object of the invention is to provide an interleaver satisfying the foregoing condition 1 and the condition 2 at the same time.

An encoding apparatus, an encoding method, and a providing medium of the invention are characterized in that interleave means replaces the input data by using an interleaver in which the sum of distances between arbitrary two points before and after replacement is a predetermined value or more, and further randomizes the replaced input data.

A decoding apparatus, a decoding method, and a providing medium are characterized by performing a deinterleave process opposite to an interleave process performed by the encoding apparatus.

BRIEF DESCRIPTION OF THE DRAWINGS

FIG. 2 is a block diagram showing a structure of a convolution encoding circuit.

FIG. 3 is a block diagram showing a structure of an interleaver.

FIG. 4 is a view for explaining data stored in a replacement ROM.

FIG. 10 is a flowchart for explaining a process of determining replacement positions.

DETAILED DESCRIPTION OF THE PREFERRED EMBODIMENTS

Preferred embodiments of the present invention will be described below in detail.

Interleave means (for example, an interleaver 71 of FIG. 8) of an encoding apparatus of the invention is characterized by comprising replacement means (for example, step S1 of FIG. 10) for replacing input data by using an interleaver in which the sum of distances between arbitrary two points before and after replacement is a predetermined value or more, and randomization means (for example, step S4 of FIG. 10) for randomizing the input data replaced by the replacement means.

A decoding apparatus of the invention is characterized by comprising deinterleave means (for example, a soft output decoding circuit 131 of FIG. 16) for performing a process opposite to an interleave process performed by the encoding apparatus.

Figure 1:
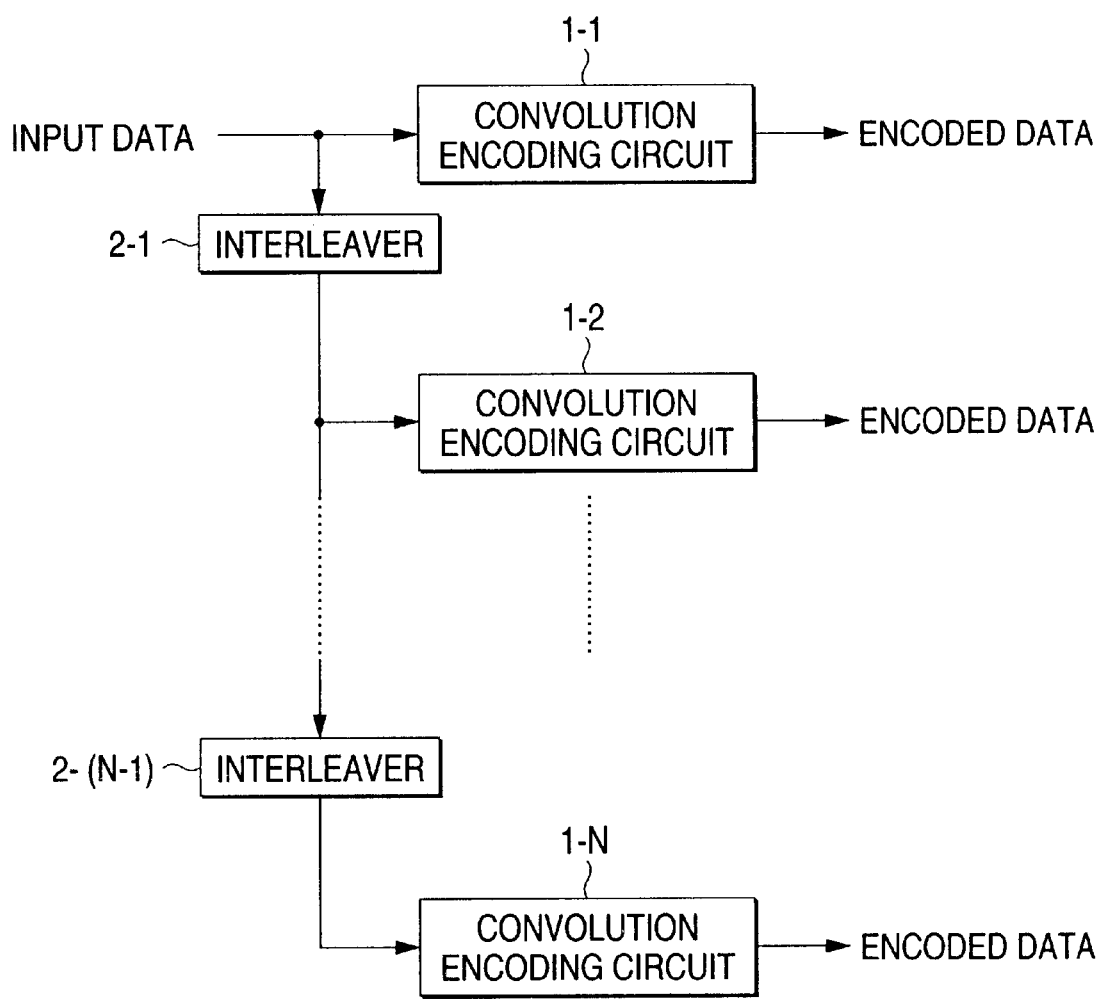
FIG. 1 is a block diagram showing a structure of an example of a conventional turbo encoding apparatus.
Figure 5:
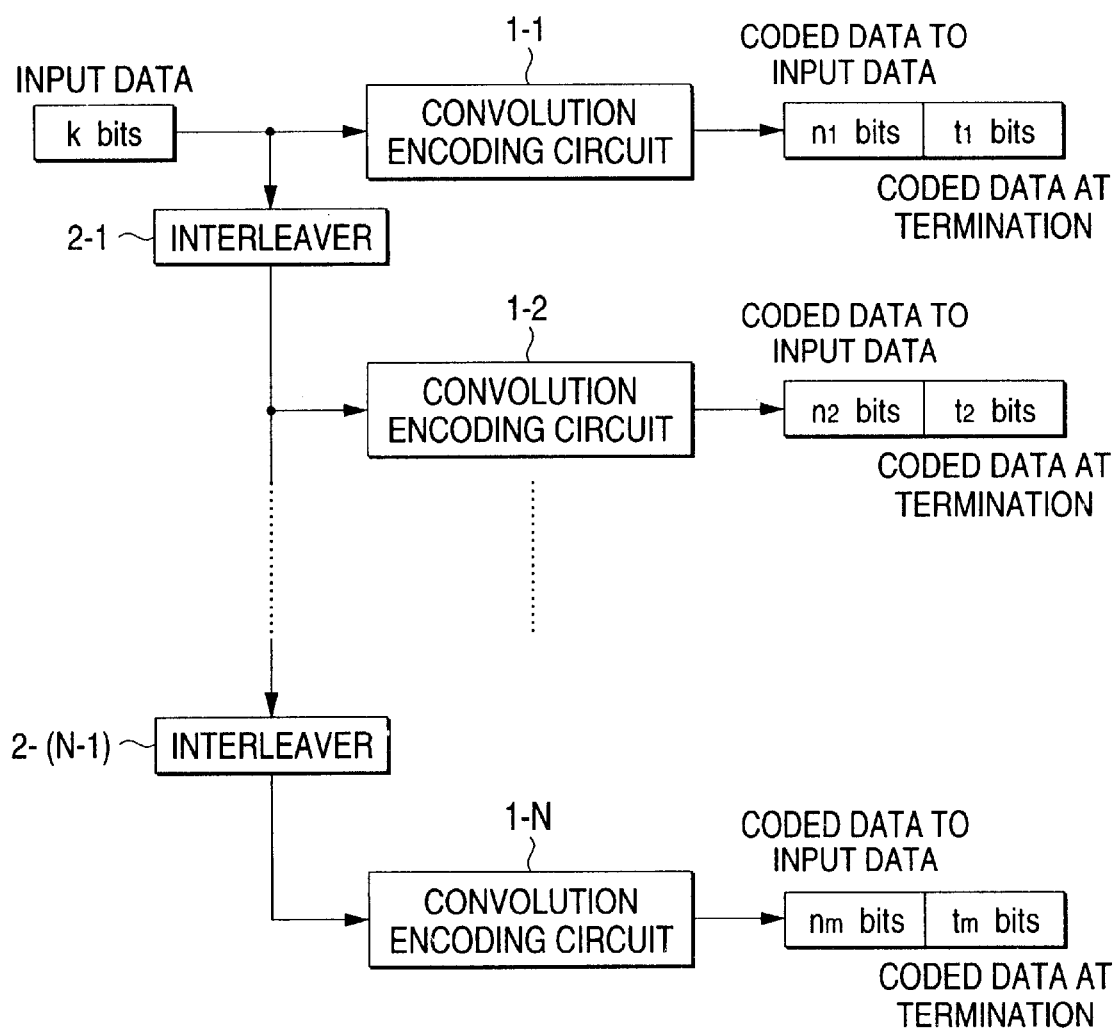
FIG. 5 is a view showing the relation between the number of bits of input data and that of encoded data in a turbo encoding apparatus.
Figure 6:
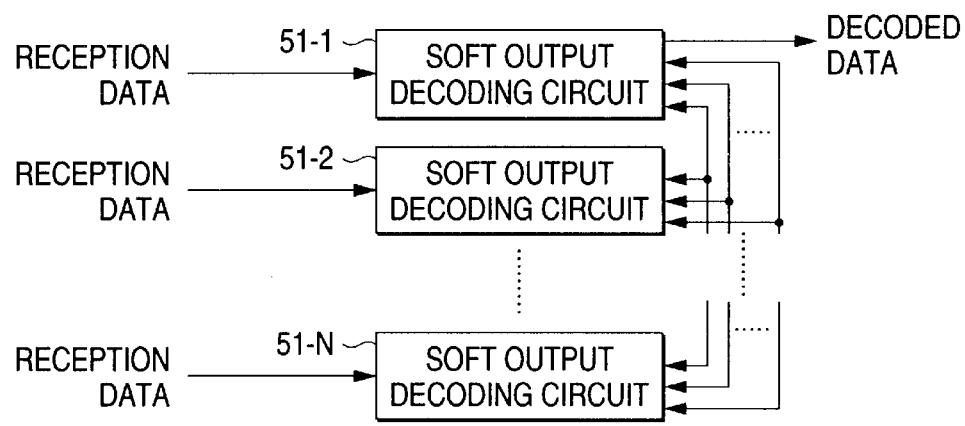
FIG. 6 is a block diagram showing a structure of a turbo decoding apparatus.
Figure 7:
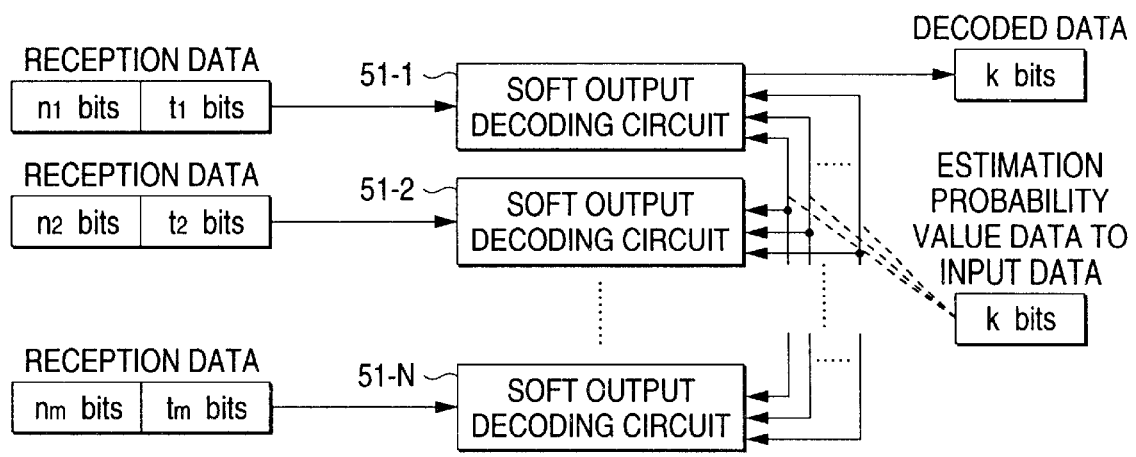
FIG. 7 is a view showing the relation between the number of bits of reception data, that of estimation probability value data, and that of decoded data in the turbo decoding apparatus.
Figure 8:
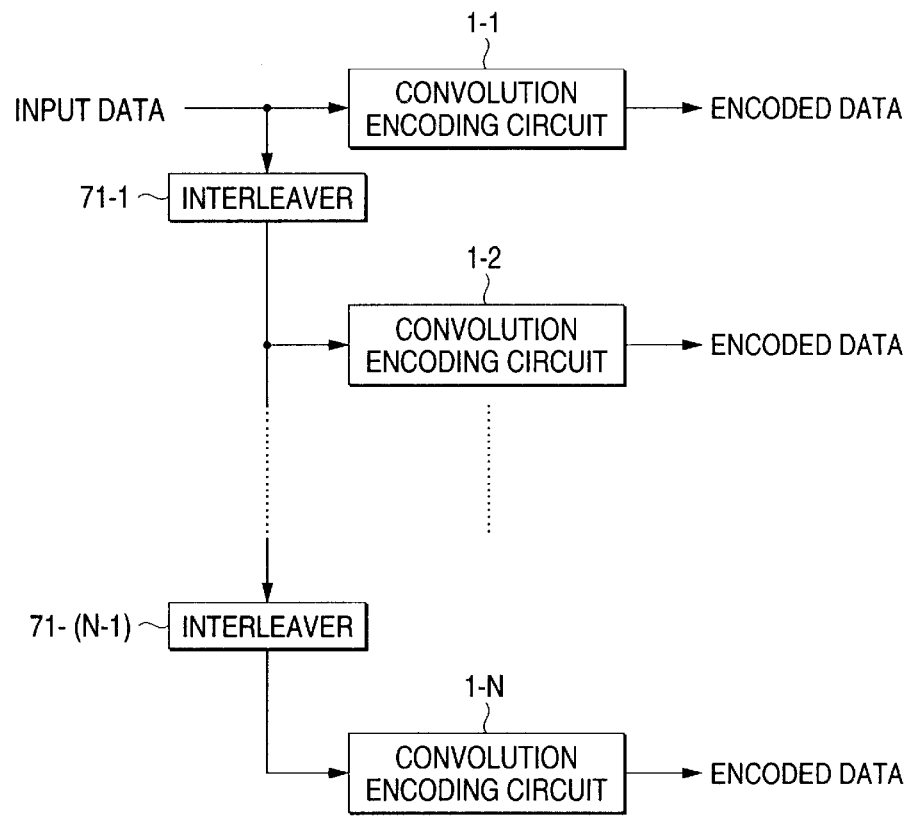
FIG. 8 is a block diagram showing a structure of an embodiment of a turbo encoding apparatus to which the present invention is applied.

FIG. 8 shows a structure of a turbo encoding apparatus 60 to which the present invention is applied. This turbo encoding apparatus 60 includes a convolution encoding circuit 1-1 for obtaining encoded data by performing convolution encoding with respect to input data, interleavers 71-1 to 71-(N−1) for sequentially interleaving the input data, and convolution encoding circuits 1-2 to 1-N for obtaining encoded data by respectively performing convolution encoding with respect to the output data of the interleavers 71-1 to 71-(N−1).

Here, the convolution encoding circuit 1 performs a convolution encoding operation with respect to inputted data and outputs an operation result as encoded data, and similarly to the foregoing case, it is structured as shown in FIG. 2. The interleaver 71 alters the sequence of inputted data and outputs them.

Figure 9:
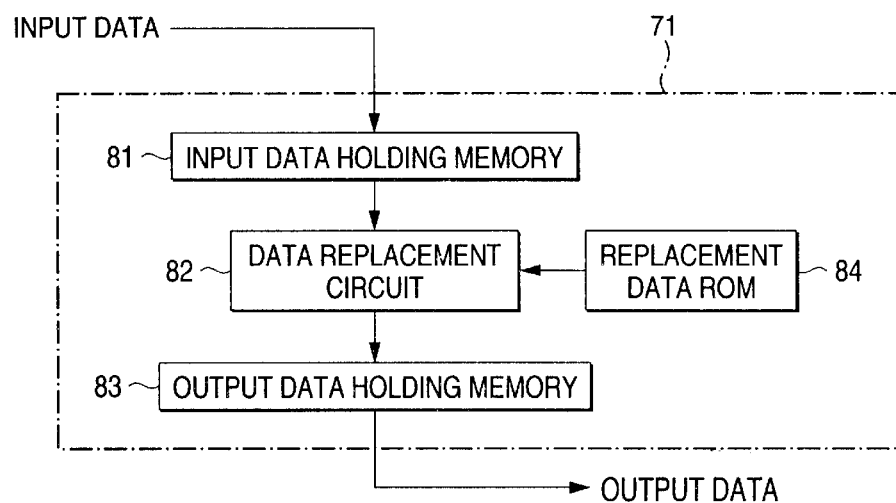
FIG. 9 is a block diagram showing a structure of an interleaver.

FIG. 9 shows a structural example of the interleaver 71. The input data inputted to the interleaver 71 are temporarily stored in an input data holding memory 81, and then, the sequence is rearranged by a data replacement circuit 82. The rearrangement of the sequence of the input data is carried out on the basis of the contents (replacement position information) of a replacement data ROM 84. Then the data in which the sequence is rearranged are stored in an output data holding memory 83, and then, are outputted as output data.

In the following, altering (replacing) of the sequence of input data performed by the interleaver 71 shown in FIG. 9 will be described. This altering is performed so as to satisfy the following two conditions.

[Condition 1] The sum of distances between arbitrary two points before and after replacement becomes sufficiently large (becomes larger than a predetermined value).

[Condition 2] In the case where replacement positions are regarded as a sequence, the sequence satisfies a mathematical property called k-equidistributioness.

As an interleaver satisfying the condition 1, there is one using affine interleave. In the affine interleave, with respect to a position i of an input signal, a predetermined constant "a" which is relatively prime to the size N of an interleaver, and an arbitrary constant "b" are used so that an input signal at the i-th position is interleaved to a position (a×i+b) mod N. Particularly, when $N=2m^2$ and $a=2m\pm1$, with respect to the arbitrary constant "b", the sum of distances between arbitrary two points before and after replacement is always made 2m or more. It is proved that the minimum value 2m of the sum of distances between arbitrary two points before and after replacement in this case is a maximum value in any interleavers with the same size. That is, an interleaver using the affine interleave having such parameters satisfies the foregoing condition 1. However, it is known that the affine interleaver does not satisfy the condition 2.

The k-equidistributioness stated in the condition 2 is such that a class number C and a dimension K are determined with respect to an interleaver with a size N, and first, a value $c=\{c|(c\times s)\leq\pi(i)<(c\times(s+1)), s=N/C, 0\leq c<C\}$ determined for an i-th replacement position $\pi(i)$ (i=0 to N-1) is made a class to which the replacement position belongs. Next, classes to which i-th, (i+1)-th, ..., (i+(K-1))-th input belong are made one vector, and a frequency of appearance of vectors determined to all i of $0\leq i\leq(N-K)$ is counted. Finally, in the case where a sequence (obtained by substituting a value of i=0 to (N-1) for $\pi(i)$) is assumed to be equally distributed, from an expected value $E=(N-K)/(C^K)$ of a frequency of appearance of each vector and a frequency of appearance $F_0, F_1, \ldots, F_{C^K-1}$ of actual ($C^K$) kinds of vectors, a value $V=\Sigma(Fj-E)^2/E$ (j=0 to ($C^k$)-1) called a ($\chi^2$) value is calculated.

To satisfy the k-equidistributioness means that in regard to a predetermined set reference value T, the ($\chi^2$) value V calculated as described above becomes V<T.

For example, let us considered the case where k-equidistributioness with a class number C of 3 and a dimension K of 2 with respect to an interleaver in which its size N is 6 and replacement positions of an input from zeroth to fifth become 4, 2, 0, 3, 1, 5, respectively, is judged with a reference value T of 2. First, a class to which each replacement position belongs is a class 0 in the case where the replacement position $\pi(i)$ is $0\leq\pi(i)<2$, a class 1 in the case where $2\leq\pi(i)<4$, and a class 2 in the case where $4\leq\pi(i)<6$. Thus, when each is classified, the classes to which the replacement positions belong become 2, 1, 0, 1, 0, 2 inturn. Vectors prepared by collecting adjacent classes every dimension k (=2) classes become (2, 1), (1, 0), (0, 1), (1, 0), and (0, 2).

There are nine kinds of vectors (0, 0), (0, 1), (0, 2), (1, 0), (1, 1), (1, 2), (2, 0), (2, 1), and (2, 2) in total, and the frequency of appearance of the respective vectors $F_0$ to $F_8$ is $F_0=0, F_1=1, F_2=1, F_3=2, F_4=0, F_5=0, F_6=0, F_7=1$, and $F_8=0$. Since the expectation value E of the frequency of appearance of the respective vectors in the case where the sequence is equally distributed becomes $E=(N-K)/(C^K)=(6-2)/(3^2)=4/9$, the ($\chi^2$) value is calculated by using this and according to the following equation.

$$V=\Sigma(F_j-E)^2/E \; (j=0 \; to \; (C^K)-1)$$

The ($\chi^2$) value V=39/4 is obtained, and the relation of V>T is obtained with respect to the first set reference value T=2, so that the k-equidistributioness is not satisfied. Since the value of the size N was made small to the class number C and the dimension K for convenience of explanation, the k-equidistributioness was not satisfied. However, actually, if judgement is made after the expectation value E is made 10 or more (the value of the size N is made sufficiently large), the k-equidistributioness is satisfied.

Preparation of replacement position data stored in the replacement data ROM 84 of the interleaver 71 will be described with reference to the flowchart of FIG. 10. In the following, a description will be made on a case of generating replacement position data such that ($p^n$) interleavers which are respectively assured that the sum of distances between arbitrary two points before and after replacement is a predetermined value or more and which have the same size, are combined with an M-sequence having coefficients of elements of Galois field GF(pñ), and an input signal is interleaved to an interleave position obtained as a result of that.

As described above, first, as the ($p^n$) interleavers which are respectively assured that the sum of distances between arbitrary two points before and after replacement is a predetermined value or more and which have the same size, the foregoing affine interleavers each having a size of N are used.

At step S1, a replacement position of an i-th input signal to the j-th ($0\leq j<p^n$) affine interleaver is determined by a replacement function $\pi_j(i)$ shown in the following.

$$\pi_j(i)=a_j\times i+b_j \bmod N$$

$$N=2\times(m^2)$$

$$a_j=2m\pm1$$

$$0\leq j<(P^n)$$

$b_j$ is arbitrary.

The order "d" of the M-sequence is made an integer "d" satisfying the following equation.

$$(p^n)^d=(p^n)\times N$$

Figure 11:
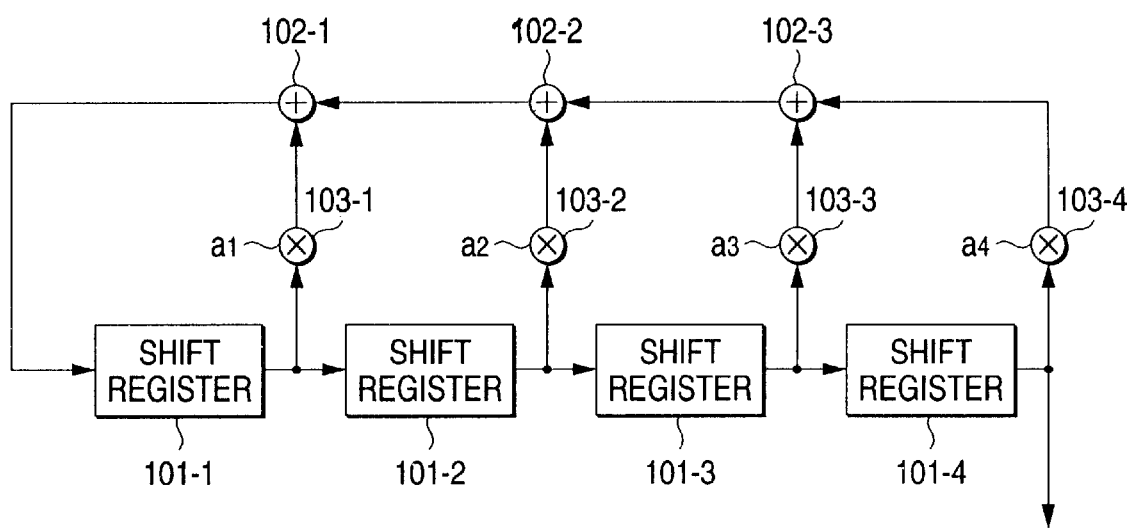
FIG. 11 is a block diagram showing a structure of an M-sequence generating circuit.

FIG. 11 is a block diagram showing an example of a case where generation of the M-sequence is realized by a circuit. An M-sequence generating circuit 90 shown in FIG. 11 includes shift registers 101-1 to 101-4, adding circuits 102-1 to 102-3 of the GF($p^n$), and multiplication circuits 103-1 to 103-4 of the GF($p^n$), and sequentially generates a replacement position signal. Coefficients $a_1$ to $a_4$ previously set in the multiplication circuits 103-1 to 103-4 are selected such that a polynomial $a_4 \times 4+a_3 \times 3+a_2 \times 2+a_1 \times 1+1$ becomes a d-th primitive irreducible polynomial in the GF($p^n$).

The shift registers 101-1 to 101-4 respectively delay input data by one unit time, and then, make output to later stage shift registers 101-2 to 101-4 or the multiplication circuit 103-4. The adding circuits 102-1 to 102-3 of the GF($p^n$) respectively add the input from the corresponding multiplication circuits 103-1 to 103-3 and the input from the later stage adding circuits 102-2 and 102-3 or the input from the multiplication circuit 103-4, and make output to the corresponding shift register 101-1 or the multiplication circuits 102-1 and 102-2. The multiplication circuits 103-1 to 103-4 of the GF(p^n) respectively output the product of the input from the corresponding shift registers 101-1 to 101-4 and the corresponding coefficients $a_1$ to $a_4$ to the corresponding adding circuits 102-1 to 102-3. Since all of the shift registers 101-1 to 101-4 are set at a value of 0 at time 0, as a result, 0 is outputted. At time 1, after the initial values are set so that all are not 0, a replacement position signal is outputted every one unit time.

At step S2, an M-sequence at time 0 to time (p^n−1) is generated by the M-sequence generating circuit 90, and the generated M-sequence is stored in an array m[i]. At step S3, the stored array m[i] is sequentially seen from i=0 to i=N×(P^−1), and a function expressed below is obtained, which indicates a position where a value t (0≤t<p^n) appears at the u-th (0≤u<N).

$$L(t, u)(0 \leq L(t, u) < (p^n \times N))$$

Finally, at step S4, a function $\pi(i)$ expressing a replacement position of an objective i-th input is obtained by using the function L(t, u) obtained from this M-sequence. The function $\pi(i)$ is shown below.

[Numerical expression 1]

$$\pi[i] = L(\lfloor i/N \rfloor, \pi_{\lfloor i/N \rfloor}(i - \lfloor i/N \rfloor \cdot N))(0 \leq i < (p^n) \times N)$$

It is proved that in the interleaver realized by storing the replacement position obtained by the function of this expression into the replacement data ROM 84, the sum of distances between arbitrary two points before and after replacement becomes 2m/(p^n) or more, and the k-equidistributioness of a class number (p^n) and a dimension (1+log$_{p^n}$N) is satisfied in regard to a very small reference value T. By this, it becomes possible to structure the interleaver having a size (p^n×N) and satisfying the condition 1 and the condition 2. As an example, a description will be made on a case where two affine interleavers each having a size N=8 are combined with a fourth M-sequence of GF(2).

As a process at step S1, a replacement function of the respective affine interleavers is determined as follows:

$$\pi_0(i) = (3 \times i) \bmod 8 (0 \leq i \leq 8)$$

$$\pi_1(i) = (5 \times i) \bmod 8 (0 \leq i < 8)$$

From a position i of an input signal and a positions $\pi_j(i)$ of replacement destination, the following relation is obtained through calculation using the above replacement function.

TABLE 1

| i | 0 | 1 | 2 | 3 | 4 | 5 | 6 | 7 |
|---|---|---|---|---|---|---|---|---|
| $\pi_0(i)$ | 0 | 3 | 6 | 1 | 4 | 7 | 2 | 5 |

TABLE 2

| i | 0 | 1 | 2 | 3 | 4 | 5 | 6 | 7 |
|---|---|---|---|---|---|---|---|---|
| $\pi_1(i)$ | 0 | 5 | 2 | 7 | 4 | 1 | 6 | 3 |

Here, in the case where the fourth M-sequence of the GF (2) is generated by the M-sequence generating circuit 90 shown in FIG. 11, the output at time 0 to time 15 becomes as follows:

Output of M-sequence generating circuit:

0100010011010111

From this, a function L(u, t), (0≤u<2, 0≤t<8) is determined as follows:

TABLE 3

| i | 0 | 1 | 2 | 3 | 4 | 5 | 6 | 7 |
|---|---|---|---|---|---|---|---|---|
| L(0,i) | 0 | 2 | 3 | 4 | 6 | 7 | 10 | 12 |

TABLE 4

| i | 0 | 1 | 2 | 3 | 4 | 5 | 6 | 7 |
|---|---|---|---|---|---|---|---|---|
| L(1,i) | 1 | 5 | 8 | 9 | 11 | 13 | 14 | 15 |

The final replacement function $\pi(i)$ becomes as follows, and values obtained from the calculation result and stored in the replacement data ROM 84 become as shown in Table 5.

[Numerical expression 2]

$$\pi[i] = L(\lfloor i/8 \rfloor, \pi_{\lfloor i/8 \rfloor}(i - \lfloor i/8 \rfloor \cdot 8))$$

TABLE 5

| (0 ≤ i < 16) | | | | | | | | | | | | | | | | |
|---|---|---|---|---|---|---|---|---|---|---|---|---|---|---|---|---|
| i | 0 | 1 | 2 | 3 | 4 | 5 | 6 | 7 | 8 | 9 | 10 | 11 | 12 | 13 | 14 | 15 |
| $\pi(i)$ | 0 | 4 | 10 | 2 | 6 | 12 | 3 | 7 | 1 | 13 | 8 | 15 | 11 | 5 | 14 | 9 |

Figure 12:
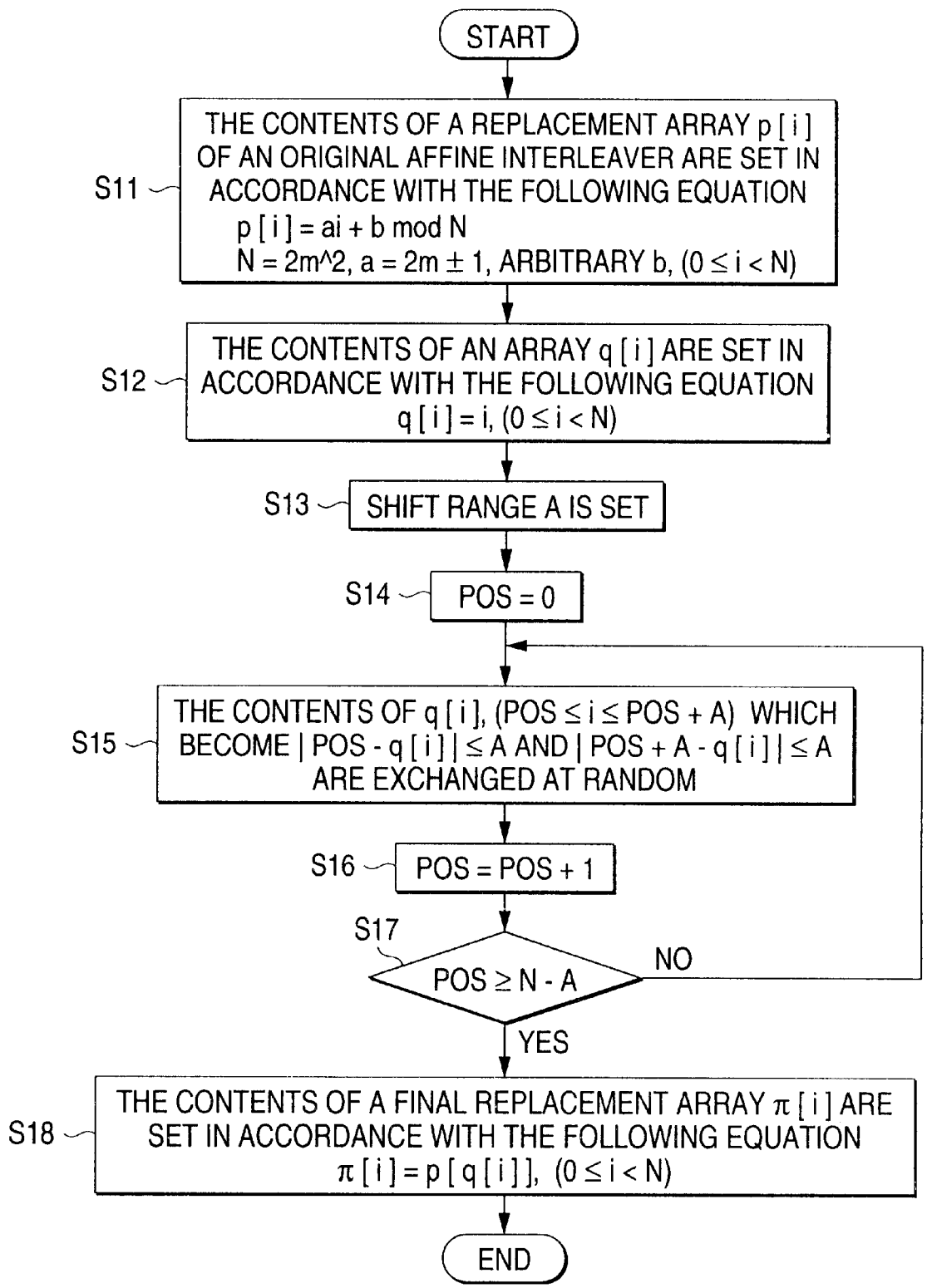
FIG. 12 is a flowchart for explaining another process of determining replacement positions.

Next, with reference to the flowchart of FIG. 12, another method of determining replacement positions will be described. In this embodiment, a description will be made on a case where replacement position data are generated such that an input signal is interleaved into an interleave position obtained from the result of varying replacement positions of an interleaver, which is assured that the sum of distances between arbitrary two points before and after replacement is a predetermined value or more, within a constant range ±a.

As an interleaver which is assured that the sum of distances between arbitrary two points before and after replacement is a predetermined value or more, an affine interleaver with a size N is used. First, at step S11, an array p[i] of replacement positions of the original affine interleaver is set by the following equation.

$$p[i] = a \times i + b \bmod N$$

N=2m^2, a=2m±1, b is arbitrary, 0≤i<N

At step S12, an array q[i] used for position variation is set as q[i]=i(0≤i<N). Next, at step S13, a parameter A for determining a variation range of a replacement position is set, and at step S14, a parameter POS is initialized to 0.

At step S15, the array q[i] which becomes an index for obtaining a new replacement array is exchanged so that a replacement position obtained from that falls in the constant variation range A. That is, the contents of q[i] at POS≤i≤POS+A, which becomes |POS−q[i]|≤A and |POS+A−q[i]|≤A, are exchanged at random.

At step S16, the value of POS is incremented by 1, and the procedure proceeds to step S17. At step S17, judgement is made on whether or not the value of POS has become (N−A) or more, and in the case where the judgement is NO, it returns to step S15 and the processes thereafter are repeated, and in the case where the judgement is YES, it proceeds to step S18.

At the process of step S18, a replacement array r[i] is obtained through the following equation, and the contents of the obtained replacement array r[i] are stored in the replacement data ROM 84.

$$r[i]=p[q[i]] (0 \leq i < N)$$

In the interleaver realized in this way, the sum of distances between arbitrary two points before and after replacement becomes 2m−2A or more, and the k-equidistributioness is satisfied. By this, it becomes possible to structure the interleaver with the size N, which satisfies the condition 1 and the condition 2.

Here, a description will be made on an example of a case where a replacement position of an affine interleaver with a size N=8 is varied with a shift range of 2. First, at step S11, a replacement function of the affine interleaver is determined as follows:

$$p(i)=(3 \times i) \bmod 8, (0 \leq i < 8)$$

The position i of input data and position p[i] of replacement destination are obtained by the above replacement function p[i] as follows:

TABLE 6

| i    | 0 | 1 | 2 | 3 | 4 | 5 | 6 | 7 |
|------|---|---|---|---|---|---|---|---|
| p[i] | 0 | 3 | 6 | 1 | 4 | 7 | 2 | 5 |

Next, at step S12, an array q[i] is set as follows:

TABLE 7

| i    | 0 | 1 | 2 | 3 | 4 | 5 | 6 | 7 |
|------|---|---|---|---|---|---|---|---|
| q[i] | 0 | 1 | 2 | 3 | 4 | 5 | 6 | 7 |

At step S13, the shift range A is set at 2. At step S14, the value of POS is made 0 as an initial value. Thereafter, the processes of steps S15 to S17 are repeated. Here, a description will be made on the process performed at step S15 and performed with respect to the array q[i] in the case where POS is varied from 0 to 5 (=N−A−1).

TABLE 8

| [when POS = 0] | | | | | | | | |
|---|---|---|---|---|---|---|---|---|
| i    | 0 | 1 | 2 | 3 | 4 | 5 | 6 | 7 |
| q[i] | 0 | 1 | 2 | 3 | 4 | 5 | 6 | 7 |

As the array q[i] (POS≦i ≦POS+A) satisfying |POS−q[i]|≦A and |POS+A−q[i]|≦A, that is, the array q[i] (0≦i≦2) satisfying |0−q[i]|≦2 and |2−q[i]|≦2, there are three of q[0], q[1], and q[2], and the contents of these are exchanged at random.

TABLE 9

| [POS = 1] | | | | | | | | |
|---|---|---|---|---|---|---|---|---|
| i    | 0 | 1 | 2 | 3 | 4 | 5 | 6 | 7 |
| q[i] | 1 | 2 | 0 | 3 | 4 | 5 | 6 | 7 |

As the array q[i] (POS≦i≦POS+A) satisfying |POS−q[i]|≦A and |POS+A−q[i]|≦A, that is, the array q[i](1≦i≦3) satisfying |1−q[i]|≦2 and |3−q[i]|≦2, there are two of q[1] and q[3], and the contents of these are exchanged at random.

TABLE 10

| [POS = 2] | | | | | | | | |
|---|---|---|---|---|---|---|---|---|
| i    | 0 | 1 | 2 | 3 | 4 | 5 | 6 | 7 |
| q[i] | 1 | 3 | 0 | 2 | 4 | 5 | 6 | 7 |

As the array q[i] (POS≦i≦POS+A) satisfying POS−q[i]|≦A and |POS+A−q[i]|≦A, that is, the array q[i](2≦i≦4) satisfying |2−q[i]|≦2 and |4−q[i]|≦2, there are two of q[3] and q[4], and the contents of these are exchanged at random.

TABLE 11

| [POS = 3] | | | | | | | | |
|---|---|---|---|---|---|---|---|---|
| i    | 0 | 1 | 2 | 3 | 4 | 5 | 6 | 7 |
| q[i] | 1 | 3 | 0 | 4 | 2 | 5 | 6 | 7 |

As the array q[i] (POS≦i≦POS+A) satisfying |POS−q[i]|≦A and |POS+A−q[i]|≦A, that is, the array q[i](3 ≦i≦5 ) satisfying |3−q[i]|≦2 and |5−q[i]|≦2, there are two of q[3] and q[5], and the contents of these are exchanged at random.

TABLE 12

| [POS = 4] | | | | | | | | |
|---|---|---|---|---|---|---|---|---|
| i    | 0 | 1 | 2 | 3 | 4 | 5 | 6 | 7 |
| q[i] | 1 | 3 | 0 | 5 | 2 | 4 | 6 | 7 |

As the array q[i] (POS≦i≦POS+A) satisfying |POS−q[i]|≦A and |POS+A−q[i]|≦A, that is, the array q[i](4≦i≦6) satisfying |4−q[i]|≦2 and |6−q[i]|≦2, there are two of q[5] and q[6], and the contents of these are exchanged at random.

TABLE 13

| [POS = 5] | | | | | | | | |
|---|---|---|---|---|---|---|---|---|
| i    | 0 | 1 | 2 | 3 | 4 | 5 | 6 | 7 |
| q[i] | 1 | 3 | 0 | 5 | 2 | 6 | 4 | 7 |

As the array q[i] (POS≦i≦POS+A) satisfying |POS−q[i]|≦A and |POS+A−q[i]|≦A, that is, the array q[i](5 ≦i≦7) satisfying |5−q[i]|≦2 and |7−q[i]|≦2, there are two of q[5] and q[7], and the contents of these are exchanged at random. As a result, q[i] indicated below is obtained.

TABLE 14

| i    | 0 | 1 | 2 | 3 | 4 | 5 | 6 | 7 |
|------|---|---|---|---|---|---|---|---|
| q[i] | 1 | 3 | 0 | 5 | 2 | 7 | 4 | 6 |

At step S17, by p[i] (Table 6) and q[i] (Table 14) obtained through the foregoing respective processes, the final replacement array r[i] is obtained through the relation of r[i]=p[q[i]].

TABLE 15

| i    | 0 | 1 | 2 | 3 | 4 | 5 | 6 | 7 |
|------|---|---|---|---|---|---|---|---|
| r[i] | 3 | 1 | 0 | 7 | 6 | 5 | 4 | 2 |

Finally, the result (Table 15) of the replacement array r[i] obtained in this way is stored in the replacement data ROM 84.

Figure 13:
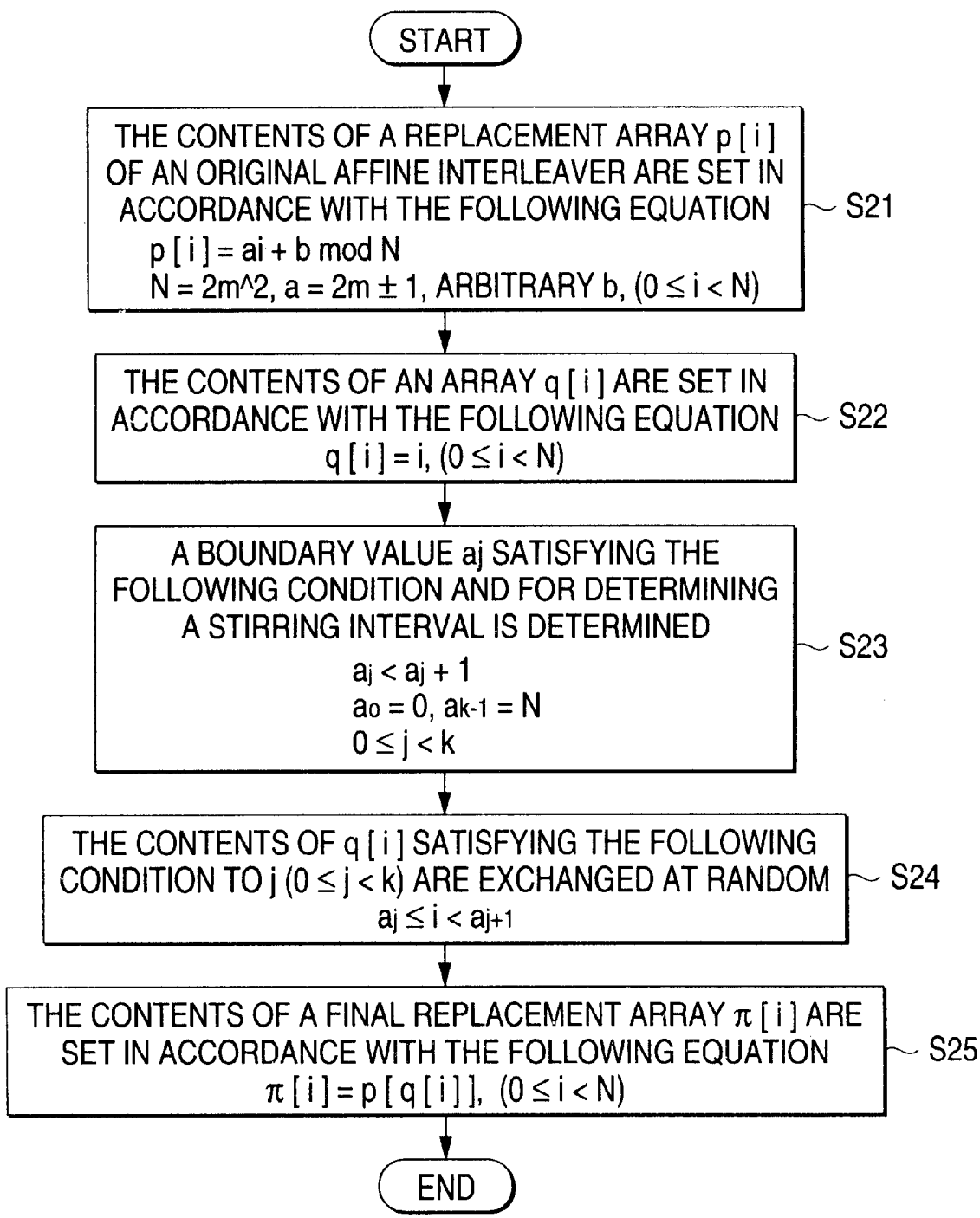
FIG. 13 is a flowchart for explaining still another process of determining replacement positions.

Next, with reference to the flowchart of FIG. 13, another way of determining a replacement position will be described. In this embodiment, a description will be made on a case where such replacement position data are generated that replacement positions of an interleaver which is assured that the sum of distances between arbitrary two points before and after replacement is a predetermined value or more, are divided by a predetermined range, and an input signal is interleaved into an interleave position obtained as a result of stirring its inside with an arbitrary algorithm.

As an interleaver which is assured that the sum of distances between arbitrary two points before and after replacement is a predetermined value or more, an affine interleaver with a size N is used. First, at step S21, an array p[i] of replacement positions of the original affine interleaver is calculated in accordance with the following equation.

$$p[i]=a \times i + b \bmod N$$

At step S22, an array q[i] used for stirring is set as q[i]=i.

Next, at step S23, a boundary value $a_j$ for determining a stirring interval is set so as to satisfy the following condition.

$$a_j < a_{j+1},\ a_0=0,\ a_{k-1}=N,\ 0 \leq j < k$$

At step S24, with respect to a predetermined j (0≦j <k), the contents of the arrays q[i] satisfying $a_j \leq i < a_{j+1}$ are exchanged at random. Finally, by the process of step S25, a replacement array r[i] is obtained in accordance with the following equation.

$$r[i]=p[q[i]]$$

The contents of the obtained replacement array r[i] (0≦i<N) are stored in the replacement data ROM 84.

In the interleaver realized in this way, the sum of distances between arbitrary two points before and after replacement becomes 2m−max{$a_{(j+1)}$−$a_{(j-1)}$} or more, and the k-equidistributioness is satisfied. By this, it becomes possible to structure the interleaver having a size N and satisfying the condition 1 and the condition 2.

Here, a description will be made on an example of a case where an affine interleaver with a size N=8 is used and replacement positions are stirred. First, at step S21, the contents of a replacement function p[i] of the affine interleaver are determined in accordance with the following equation.

$$p[i]=(3 \times i) \bmod 8,\ (0 \leq i < 8)$$

From the position i of input data and the position p[i] of replacement destination, the following relation is obtained by the above replacement function.

TABLE 16

| i    | 0 | 1 | 2 | 3 | 4 | 5 | 6 | 7 |
|------|---|---|---|---|---|---|---|---|
| p[i] | 0 | 3 | 6 | 1 | 4 | 7 | 2 | 5 |

Next, at step S22, q[i] is set as follows:

TABLE 17

| i    | 0 | 1 | 2 | 3 | 4 | 5 | 6 | 7 |
|------|---|---|---|---|---|---|---|---|
| q[i] | 0 | 1 | 2 | 3 | 4 | 5 | 6 | 7 |

At step S23, a boundary value for determining a stirring interval is set as follows:
boundary value: $a_0=0$, $a_1=2$, $a_2=4$, $a_3=6$, $a_4=8$ Next, at step S24, with respect to a predetermined j(0≦j<5), the contents of the arrays q[i] satisfying $a_j \leq i < a_{j+1}$ are exchanged at random. In the case of this example, the contents of q[0] and q[1], q[2] and q[3], q[4] and q[5], and q[6] and q[7] are exchanged at random, and as shown in Table 18, new q[i] is obtained.

TABLE 18

| i    | 0 | 1 | 2 | 3 | 4 | 5 | 6 | 7 |
|------|---|---|---|---|---|---|---|---|
| q[i] | 1 | 0 | 2 | 3 | 5 | 4 | 7 | 6 |

Finally, at step S25, a final replacement array r[i] is obtained by using p[i] (Table 16) and q[i] (Table 18) obtained through the foregoing processes and by the relation of r[i]=p[q[i]] as shown in Table 19.

TABLE 19

| i    | 0 | 1 | 2 | 3 | 4 | 5 | 6 | 7 |
|------|---|---|---|---|---|---|---|---|
| r[i] | 3 | 0 | 6 | 1 | 7 | 4 | 5 | 2 |

The contents of the thus obtained replacement array r[i] are stored in the replacement data ROM 84.

Figure 14:
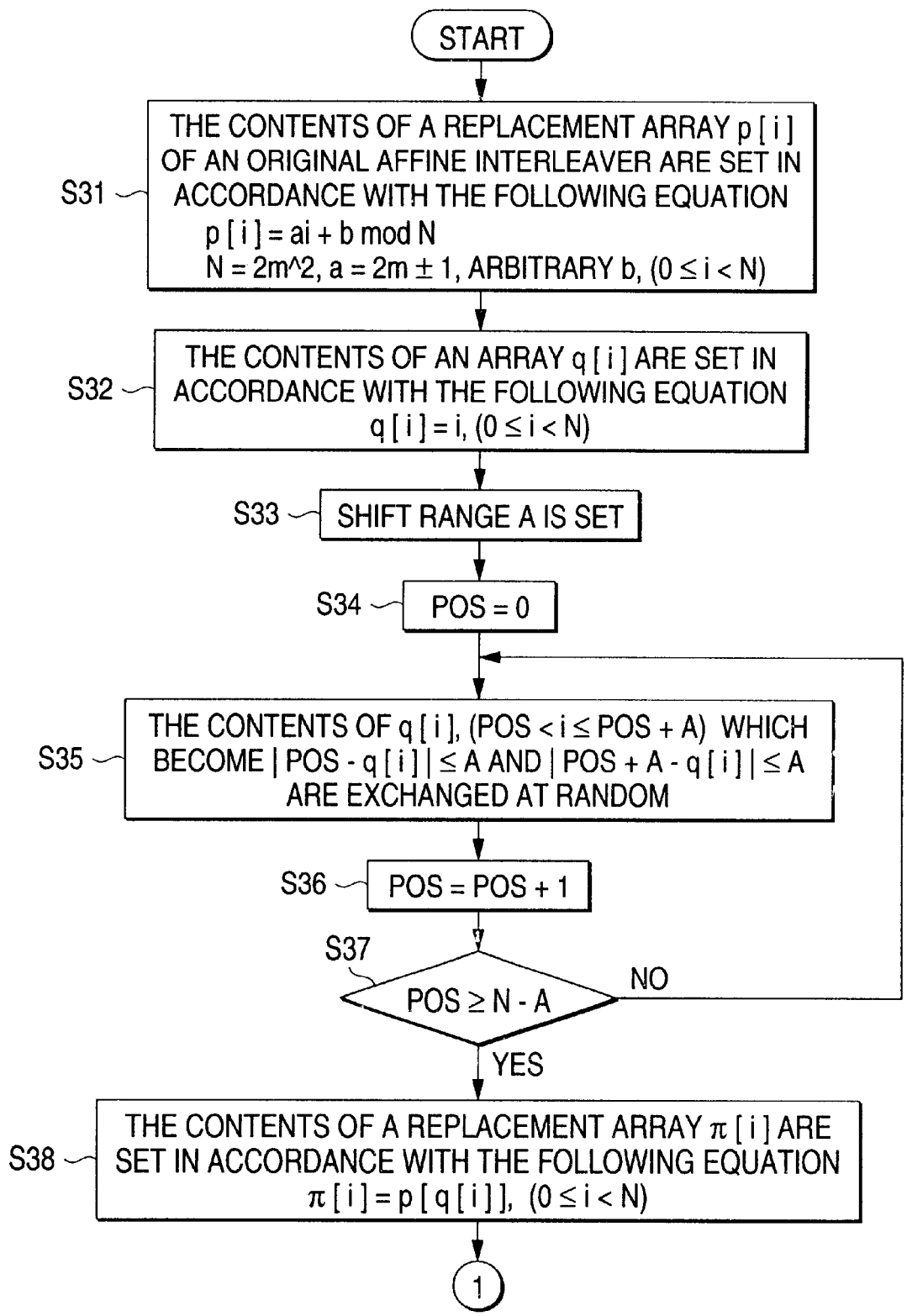
FIG. 14 is a flowchart for explaining still another process of determining replacement positions.

Next, with reference to the flowcharts of FIGS. 14 and 15, another way of determining replacement positions will be described. In this embodiment, a description will be made on a case where such replacement position data are generated that an input signal is interleaved into an interleave position obtained from the result that replacement positions of an interleaver, which is assured that the sum of distances between arbitrary two points before and after replacement is a predetermined value or more, are varied in a constant range ±a, and then, the replacement positions are divided by a predetermined range, and its inside is stirred with an arbitrary algorithm, or such replacement position data are generated that an input signal is interleaved into an interleave position obtained from the result that replacement positions of an interleaver, which is assured that the sum of distances between arbitrary two points before and after replacement is a predetermined value or more, are divided by a predetermined range, and its inside is stirred with an arbitrary algorithm, and further, the replacement positions are varied in a constant range ±a. That is, this example is a combination of the embodiment explained in FIG. 12 and the embodiment explained in FIG. 13.

As an interleaver which is assured that the sum of distances between arbitrary two points before and after replacement is a predetermined value or more, an affine interleaver with a size N is used. Since processes at steps S31 to S38 are the same as the processes at steps S11 to S18 of FIG. 12, their explanation will be omitted.

Figure 15:
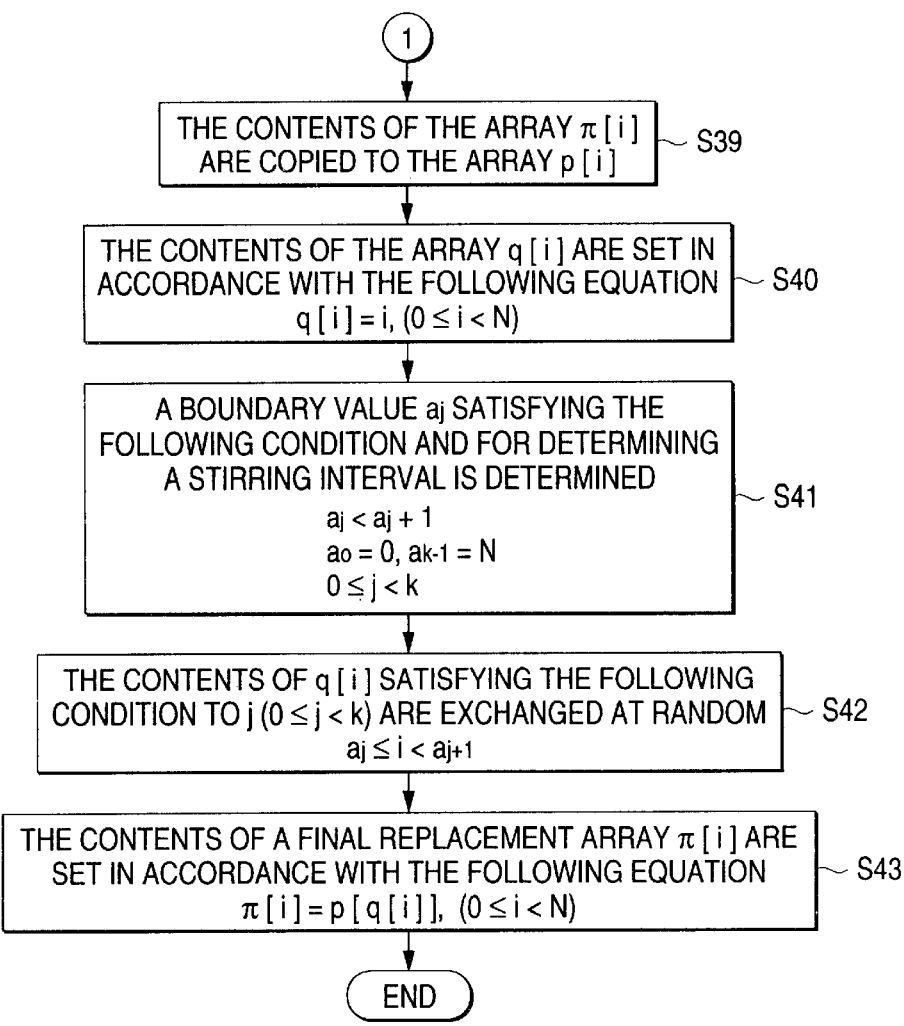
FIG. 15 is a flowchart subsequent to FIG. 14

The contents of an array r[i] obtained through the processes at steps S31 to S38 are copied to an array p[i] at step S39 (FIG. 15). By using this copied array p[i], processes subsequent to step S40 are performed. Since processes at step S40 to S43 are the same as the processes at step S22 to S25 of FIG. 13, their explanation will be omitted.

Here, a description will be made on a case where after replacement positions of an affine interleaver with a size N=8 are varied with a shift range of 2, the replacement positions are further divided by a predetermined range, and its inside is stirred. First, at step S31, a replacement function p[i] of the affine interleaver is determined as follows:

$$p[i]=(3 \times i) \bmod 8 (0 \leq i < 8)$$

From the position i of input data and the position p[i] of replacement destination, the relation as shown in Table 20 is obtained through the above replacement function p[i].

TABLE 20

| i | 0 | 1 | 2 | 3 | 4 | 5 | 6 | 7 |
|---|---|---|---|---|---|---|---|---|
| p[i] | 0 | 3 | 6 | 1 | 4 | 7 | 2 | 5 |

Next, at step S32, q[i] is set as follows:

TABLE 21

| i | 0 | 1 | 2 | 3 | 4 | 5 | 6 | 7 |
|---|---|---|---|---|---|---|---|---|
| q[i] | 0 | 1 | 2 | 3 | 4 | 5 | 6 | 7 |

At step S33, a shift range A=2 is set, and at step S34, POS=0 is set. An example of q[i] obtained as a result that the processes of steps S35 to S37 are performed from POS=0 to 5 (=N–A–1) is shown in Table 22.

TABLE 22

| i | 0 | 1 | 2 | 3 | 4 | 5 | 6 | 7 |
|---|---|---|---|---|---|---|---|---|
| q[i] | 1 | 3 | 0 | 5 | 2 | 7 | 4 | 6 |

From p[i] (Table 20) and q[i] (Table 22) obtained in this way, r[i] generated at step S37 is shown below.

TABLE 23

| i | 0 | 1 | 2 | 3 | 4 | 5 | 6 | 7 |
|---|---|---|---|---|---|---|---|---|
| r[i] | 3 | 1 | 0 | 7 | 6 | 5 | 4 | 2 |

At step S39, the contents of r[i] are copied to p[i]. The result is shown below.

TABLE 24

| i | 0 | 1 | 2 | 3 | 4 | 5 | 6 | 7 |
|---|---|---|---|---|---|---|---|---|
| p[i] | 3 | 1 | 0 | 7 | 6 | 5 | 4 | 2 |

Further, at step S40, q[i] is set as follows:

TABLE 25

| i | 0 | 1 | 2 | 3 | 4 | 5 | 6 | 7 |
|---|---|---|---|---|---|---|---|---|
| q[i] | 0 | 1 | 2 | 3 | 4 | 5 | 6 | 7 |

At step S41, a boundary value for determining a stirring range is determined as follows:

boundary value: $a_0=0$, $a_1 32\ 2$, $a_2=4$, $a_3=6$, $a_4=8$ Next, at step S42, with respect to a predetermined j ($0 \leq j < 5$), the contents of the arrays q[i] satisfying $a_j \leq i < a_{j+1}$ are exchanged at random. In this case, the contents of q[0] and q[1], q[2] and q[3], q[4] and q[5], and q[6] and q[7] are exchanged at random, and the relation indicated below is obtained.

TABLE 26

| i | 0 | 1 | 2 | 3 | 4 | 5 | 6 | 7 |
|---|---|---|---|---|---|---|---|---|
| q[i] | 1 | 0 | 2 | 3 | 5 | 4 | 6 | 7 |

Finally, at step S43, a final replacement array r[i] is obtained by using p[i] (Table 24) and q[i] (Table 26) obtained through the foregoing processes, and by the relation of r[i]=p[q[i]]. The obtained result is shown in Table 27.

TABLE 27

| i | 0 | 1 | 2 | 3 | 4 | 5 | 6 | 7 |
|---|---|---|---|---|---|---|---|---|
| r[i] | 1 | 3 | 0 | 7 | 5 | 6 | 4 | 2 |

The thus obtained result is stored in the replacement data ROM 84.

Figure 16:
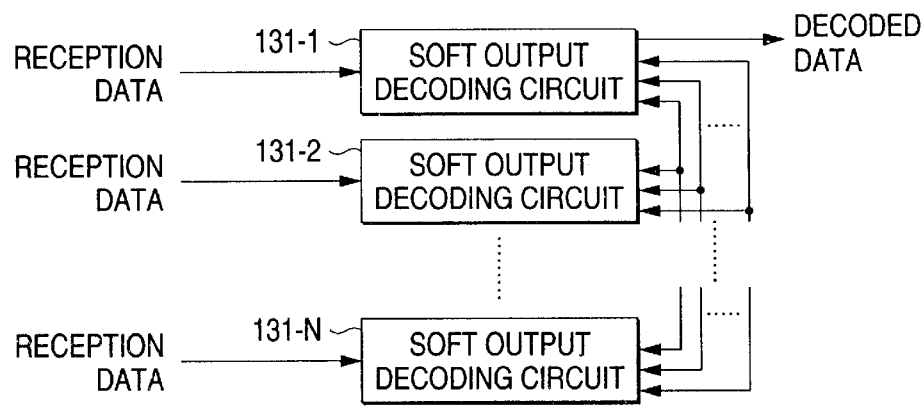
FIG. 16 is a block diagram showing a structure of a turbo decoding apparatus.

FIG. 16 shows a structure of a turbo decoding apparatus 120. This turbo decoding apparatus 120 decodes encoded data outputted from the turbo encoding apparatus 60 shown in FIG. 8, and obtains decoded data. This turbo decoding apparatus 120 includes a plurality of soft output decoding circuits 131-1 to 131-N corresponding to the number of encoded data (reception data) outputted from the turbo encoding apparatus 60. The soft output decoding circuit 131 is constituted by using a so-called soft output decoding system which has a function to calculate a probability that input data at an encoding side are 0 or 1, such as a MAP decoder and a SOVA decoder. Each of the soft output decoding circuits 131 includes a deinterleaver to perform a process opposite to a process performed by the interleaver 71 of the turbo encoding apparatus 60 of FIG. 8.

The operation of the turbo decoding apparatus 120 shown in FIG. 16 will be described. Reception data (encoded data) are supplied to the soft output decoding circuits 131-1 to 131-N, respectively. In the respective soft output decoding circuits 131, estimation probability value data with respect to input data at the encoding side are used one another, and several to several tens repetitive decoding operations are performed. Then final decoding data are outputted from an arbitrary decoding circuit (in FIG. 16, the soft output decoding circuit 131-1).

Like this, in the embodiments, a plurality of interleavers in which the sum of distances between arbitrary two points before and after replacement is assured, and which satisfy the condition 1, for example, the foregoing affine interleavers are combined with each other using the M-sequence as a method of generating a random number sequence, or an interleaver in which the sum of distances between arbitrary two points before and after replacement is assured and which satisfies the condition 1 is subjected to randomization with a specific randomizing algorithm, so that it becomes possible to structure an interleaver satisfying the following two conditions:

[condition 1] the sum of distances before and after replacement becomes sufficiently large,

[condition 2] in the case where replacement positions are regarded as a sequence, the sequence satisfies a mathematical property called k-equidistributioness, and it becomes possible to realize a turbo encoding/decoding apparatus with a high error correction capability.

Incidentally, in the foregoing embodiments, although the present invention is applied to the turbo encoding apparatus and the turbo decoding apparatus, the invention may be applied to other encoding apparatuses and decoding apparatuses, and an interleaver other than the affine interleaver may be used.

Besides, in the present specification, as a providing medium for providing a computer program for implementing the above processes, in addition to an information recording medium such as a magnetic disk or a CD-ROM, a transmission medium through a network such as the Internet or digital satellite is also included.

According to the encoding apparatus, the encoding method, and the providing medium as described in the invention, interleave is performed by replacing input data using an interleaver in which the sum of distances between arbitrary two points before and after replacement is a predetermined value or more and by further making randomization. Thus, it becomes possible to perform the interleave in such a manner that the sum of distances between arbitrary two points before and after replacement becomes large, and in the case where replacement positions are regarded as a sequence, the sequence satisfies the k-equidistributioness.

Moreover, according to the decoding apparatus, the decoding method, and the providing medium as described in the invention, deinterleave is performed through a process opposite to the interleave process performed by the encoding apparatus. Thus, it becomes possible to decode encoded data which have been interleaved in such a manner that the sum of distances between arbitrary two points before and after replacement becomes large, and in the case where replacement positions are regarded as a sequence, the sequence satisfies the k-equidistributioness.

What is claimed is:

1. An encoding apparatus comprising:
    convolution means for performing convolution encoding with respect to input data; and
    interleave means for sequentially interleaving the input data, the encoding apparatus being characterized in that the interleave means comprises:
        replacement means for replacing the input data by using an interleaver in which the sum of distances between arbitrary two points before and after replacement is a predetermined value or more; and
        randomization means for randomizing the input data replaced by the replacement means.

2. An encoding apparatus according to claim 1, wherein the replacement means uses an affine interleaver.

3. An encoding apparatus according to claim 1, wherein the randomization means uses random numbers satisfying k-equidistributioness in which the number of occurrences of 1 and that of 0 are equal to each other.

4. An encoding apparatus according to claim 1, wherein the randomization means repeats randomization while varying a range of the data to be randomized in a range of ±a ("a" is an integer).

5. An encoding apparatus according to claim 1, wherein the randomization means sets a predetermined range and applies a predetermined algorithm to the data in the range to make randomization.

6. An encoding apparatus according to claim 1, wherein the randomization means varies a range of the data to be randomized in a range of ±a, and then, applies a predetermined algorithm into a predetermined range to make randomization, or the randomization means sets a predetermined range and applies a predetermined algorithm into the range to make randomization, and then, further varies while making randomization in the range of ±a.

7. An encoding method which performs convolution encoding with respect to input data and sequentially performs interleave with respect to the input data, the encoding method being characterized in that
    the interleave comprises:
        a replacing step of replacing the input data by using an interleaver in which the sum of distances between arbitrary two points before and after replacement is a predetermined value or more; and
        a randomizing step of randomizing the input data replaced at the replacing step.

8. An encoding method according to claim 7, wherein the replacing step uses an affine interleaver.

9. An encoding method according to claim 7, wherein the randomizing step uses random numbers satisfying k-equidistributioness in which the number of occurrences of 1 and that of 0 are equal to each other.

10. An encoding method according to claim 7, wherein the randomizing step repeats randomization while varying a range of the data to be randomized in a range of ±a ("a" is an integer).

11. An encoding method according to claim 7, wherein the randomizing step sets a predetermined range and applies a predetermined algorithm to the data in the range to make randomization.

12. An encoding method according to claim 7, wherein the randomizing step varies a range of the data to be randomized in a range of ±a, and then, applies a predetermined algorithm into a predetermined range to make randomization, or the randomizing step sets a predetermined range and applies a predetermined algorithm into the range to make randomization, and then, further varies while making randomization in the range of ±a.

13. A providing medium characterized by providing a computer-readable program which causes
    interleave means of an encoding apparatus, which includes convolution means for performing convolution encoding with respect to input data and interleave means for sequentially interleaving the input data, to execute a process comprising:
        a replacing step of replacing the input data by using an interleaver in which the sum of distances between arbitrary two points before and after replacement is a predetermined value or more; and
        a randomizing step of randomizing the input data replaced at the replacing step.

14. A decoding apparatus for decoding encoded data outputted from an encoding apparatus for encoding input data while performing an interleave process through combination of:
    replacement means for replacing the input data by using an interleaver in which the sum of distances between arbitrary two points before and after replacement is a predetermined value or more; and
    randomization means for randomizing the data replaced by the replacement means,
    characterized in that the decoding apparatus comprises:
        deinterleave means for performing a process opposite to an interleave process performed by the encoding apparatus.

15. A decoding method for decoding encoded data outputted from an encoding apparatus for encoding input data while performing an interleave process through combination of:
    replacement means for replacing the input data by using an interleaver in which the sum of distances between arbitrary two points before and after replacement is a predetermined value or more; and
    randomization means for randomizing the data replaced by the replacement means,
    characterized in that the decoding method comprises:
        a deinterleave step of performing a process opposite to an interleave process performed by the encoding apparatus.

16. A providing medium characterized by providing a computer-readable program to cause
    a decoding apparatus for decoding encoded data outputted from an encoding apparatus for encoding input data while performing an interleave process through combination of:

replacement means for replacing the input data by using an interleaver in which the sum of distances between arbitrary two points before and after replacement is a predetermined value or more; and randomization means for randomizing the data replaced by the replacement means,

5 to execute a process comprising:

a deinterleave step of performing a process opposite to an interleave process performed by the encoding apparatus.

* * * * *